/ United States Patent (12) United States Patent
Turner et al.

(10) Patent No.: US 11,652,488 B2
(45) Date of Patent: May 16, 2023

(54) PHASE COHERENT FREQUENCY SYNTHESIS (71) Applicant: BAE Systems Information and Electronic Systems Integration Inc., Nashua, NH (US)

(72) Inventors: Steven E. Turner, Nashua, NH (US); Joseph D. Cali, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 17/689,605

(22) Filed: Mar. 8, 2022

(65) Prior Publication Data
US 2022/0278687 A1 Sep. 1, 2022

Related U.S. Application Data (62) Division of application No. 17/188,518, filed on Mar. 1, 2021, now Pat. No. 11,303,287.

(51) Int. Cl.
H03L 7/197 (2006.01)
H03L 7/093 (2006.01)
(Continued)

(52) U.S. Cl.
CPC ............. H03L 7/093 (2013.01); G06F 1/022 (2013.01); H03L 7/1976 (2013.01); H03M 3/30 (2013.01)

(58) Field of Classification Search
CPC ........ H03L 7/1976; H03L 7/093; G06F 1/022
See application file for complete search history.

(56) References Cited

U.S. PATENT DOCUMENTS 7,680,236 B1 * 3/2010 Melanson ............. H03L 7/1976
375/376
8,082,462 B1 * 12/2011 Tidwell ..................... G06F 1/12
713/400

(Continued)

OTHER PUBLICATIONS

Tierney C. et al., "A Digital Frequency Synthesizer", IEEE Transactions on Audio Electroacoustics, Mar. 1971, vol. AU-19, pp. 48-57.

(Continued)

Primary Examiner — Sibin Chen
(74) Attorney, Agent, or Firm — Scott J. Asmus; Finch & Maloney PLLC (57) ABSTRACT Techniques are provided for phase coherent frequency synthesis. An embodiment includes a first phase accumulator to accumulate a frequency control word (FCW) at a clocked rate to produce a first digital phase signal representing phase data corresponding to phase points on a first sinusoidal waveform. The embodiment also includes a second phase accumulator to produce an incrementing reference count at the clocked rate and multiply it by the FCW to produce a second digital phase signal representing phase data corresponding to phase points on a second sinusoidal waveform. The multiplication is performed in response to change in the FCW. The embodiment further includes a multiplexer to select between the first and second digital phase signals based on completion of the multiplication. The embodiment also includes a phase-to-amplitude converter to generate digital amplitude data corresponding to the phase points on a sinusoidal waveform associated with the selected digital phase signal.

7 Claims, 8 Drawing Sheets (51) Int. Cl.
*H03M 3/00* (2006.01)
*G06F 1/02* (2006.01)

(56) References Cited

U.S. PATENT DOCUMENTS

| | | | |
|---|---|---|---|
| 8,115,519 B2 | 2/2012 | Turner | |
| 8,664,990 B2 | 3/2014 | Turner et al. | |
| 9,092,067 B2 | 7/2015 | Fawley et al. | |
| 9,479,185 B2 | 10/2016 | Cali et al. | |
| 10,680,624 B2 * | 6/2020 | Kearney | H03L 7/093 |
| 10,784,872 B1 * | 9/2020 | Tsai | H03L 7/087 |
| 2006/0020865 A1 | 1/2006 | Dai | |
| 2016/0248431 A1 * | 8/2016 | Luo | H03L 7/193 |

OTHER PUBLICATIONS

Nagvajara P. et al., "A Phase-Coherent Numerically Controlled Oscillator Based on Pipeline Architecture", 1998, in proceedings of the 11th Annual IEEE International Conference (ASIC), pp. 355-358.

Harney A., "Achieving Phase Coherence Between Multiple Fractional-N PLLs ADF4350 Phase Resync and Phase Programmability", Application Note, Norwood, MA, USA: Analog Devices, 2010, 10 pages.

Turner S. et al., "Phase Coherent Frequency Hopping in Direct Digital Synthesizers and Phase Locked Loops", EEE Transactions on Circuits and Systems, Jun. 2020, vol. 67, pp. 1815-1823.

Turner S. et al., "Phase Coherent Frequency Synthesis", U.S. Appl. No. 17/188,518, filed Mar. 1, 2021.

\* cited by examiner

PHASE COHERENT FREQUENCY SYNTHESIS

CROSS-REFERENCE TO RELATED APPLICATIONS

This application is a divisional of U.S. patent application Ser. No. 17/188,518, filed on Mar. 1, 2021, which is herein incorporated by reference in its entirety.

FIELD OF DISCLOSURE

The present disclosure relates to frequency synthesis, and more particularly, to techniques for phase coherent frequency synthesis with improved efficiency.

BACKGROUND

Direct digital synthesizers (DDSs) can be used to produce analog waveforms, such as a sine wave, of various frequencies. The ability to produce the waveforms accurately and to control the waveforms may be important for various applications and industries such as communications and electronic warfare. Additional devices such as fractional-N phase-locked loops (PLLs) can be used for synthesizing frequencies at a non-integer scalar frequency of an input reference signal, and Delta-Sigma Modulators (DSMs) can be used to reduce the magnitude of fractional spurs near the PLL carrier in comparison to single accumulator fractional-N PLLs.

For many applications it is desirable for these devices (DDSs, Fractional-N PLLs, and DSMs) to maintain phase coherency when switching from a first frequency to a second frequency and then back to the first frequency. Existing implementations typically achieve phase coherency at the expense of increased computation, for example by requiring a computationally intensive multiply on each clock cycle, which may be impractical for many applications.

Although the following Detailed Description will proceed with reference being made to illustrative embodiments, many alternatives, modifications, and variations thereof will be apparent in light of this disclosure.

DETAILED DESCRIPTION

Techniques are provided for efficient phase coherent frequency synthesis. These techniques can be applied to a variety of devices including DDSs, Fractional-N PLLs, and DSMs. As noted previously, the ability to accurately produce and control sinusoidal waveforms is important for various applications including instrumentation, communications, and defense systems. In particular, the ability to maintain phase coherency when the frequency of the sinusoidal waveform changes, as in a frequency hopping system, can be a requirement of many applications. Existing techniques either fail to maintain phase coherency, use parallel systems for each possible frequency (which is expensive and not scalable), or use other computationally intensive approaches. To this end, and in accordance with an embodiment of the present disclosure, an efficient phase coherent frequency synthesis technique is provided, as will be explained in greater detail below, which limits the need for computationally expensive multiplication operations to only those times when the frequency switches or hops, which is typically infrequent compared to the time periods during which the frequency remains constant between hops.

For example, a system to implement the disclosed techniques can be hosted on, or otherwise be incorporated into a communications system, an electronic warfare system, a personal computer, workstation, laptop computer, tablet, touchpad, portable computer, handheld computer, cellular telephone, smartphone, messaging device, or embedded system, to name just a few possibilities. In particular, the disclosed techniques are useful for systems that employ frequency hopping and require phase coherency between hops. In accordance with an embodiment, a methodology to implement these techniques includes accumulating a frequency control word (FCW) in response to a clock signal to produce a first digital phase signal. The first digital phase signal represents phase data corresponding to phase points on a first sinusoidal waveform. The method also includes incrementing a reference count in response to the clock signal and multiplying the incrementing reference count by the FCW when a change in the FCW is detected. The multiplication produces a second digital phase signal representing phase data corresponding to phase points on a second sinusoidal waveform. The method further includes selecting (e.g., multiplexing) between the first and second digital phase signals based on the completion status of the multiplication operation. If the multiplication operation has completed then the second digital phase signal is selected, otherwise the first digital phase signal is selected. The method further includes generating a digital amplitude signal based on the selected digital phase signal. The digital amplitude signal represents digital amplitude data corresponding to the phase points on a selected sinusoidal waveform that is associated with the selected digital phase signal. The method further includes converting the digital amplitude signal into an analog sinusoidal signal.

It will be appreciated that the techniques described herein may provide improved systems and methods for phase coherent frequency synthesis, compared to systems that either fail to maintain phase coherency or that require computationally expensive multiplications on every clock cycle. The disclosed techniques can provide relatively power efficient DDSs, Fractional-N PLLs, and DSMs. Numerous embodiments and applications will be apparent in light of this disclosure.

Figure 1:
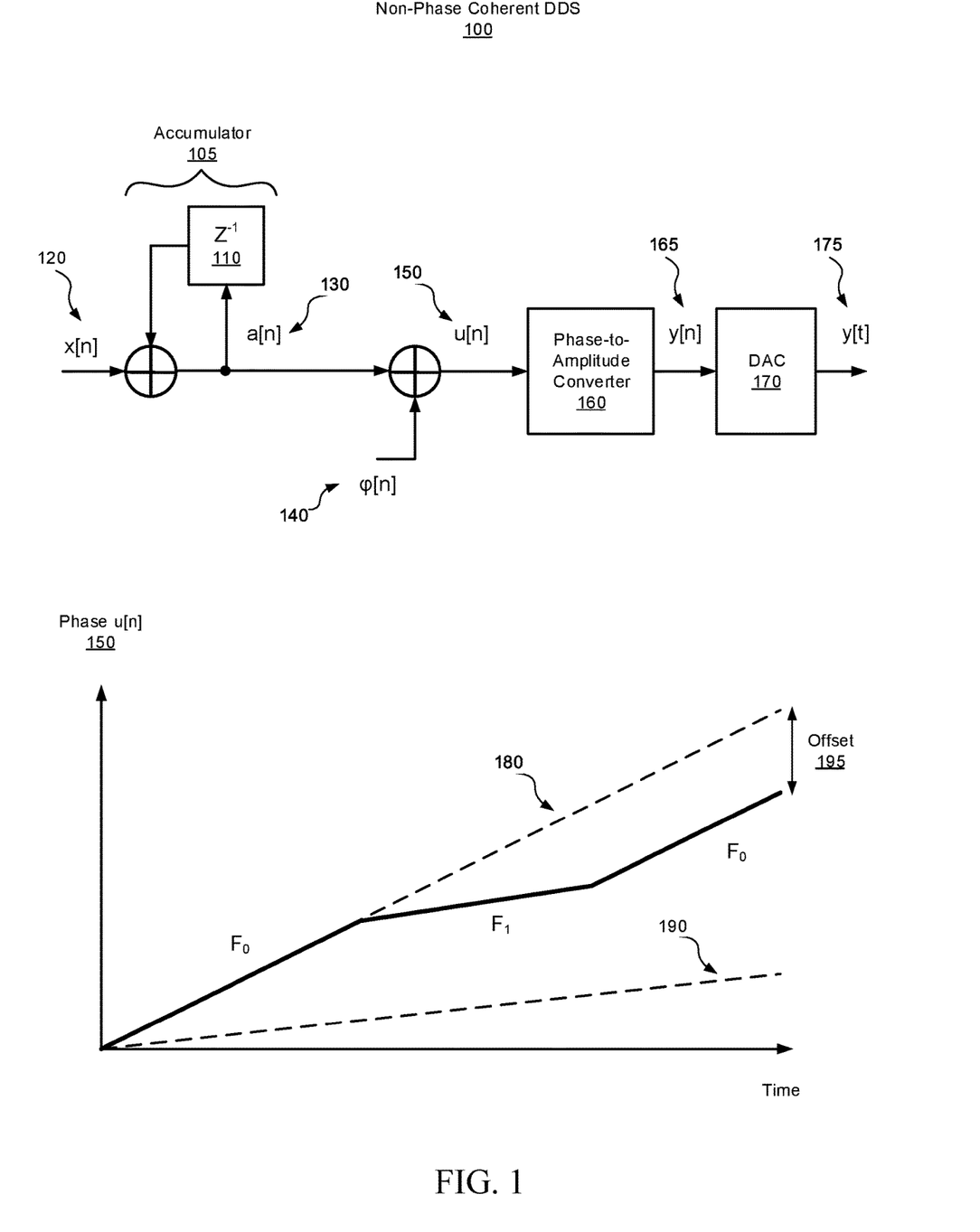
FIG. 1 is a block diagram of a non-phase coherent DDS and the resulting phase output.

FIG. 1 is a block diagram of a non-phase coherent DDS 100 and the resulting phase output 150. The DDS 100 accepts an FCW, x[n] 120, sampled on each cycle (n) of a clock signal and accumulates the FCW over time as a[n] 130. The accumulator 105 comprises a summer and a delay element 110 as shown. An additional summer may also be used to add a desired phase offset φ[n] 140 to a[n], at any sample n to generate an incrementing digital phase signal u[n] 150. The phase signal u[n] represents phase points on a sinusoidal waveform (e.g., phase angles). The accumulator 105 generates phase data that increments to step through the phase points for a complete cycle (e.g., the angular phase range of 0° to 360° or 0 to $2\pi$ radians) of the sinusoidal waveform. The rate at which the phase u[n] increases, and thus the frequency of the DDS, is controlled by x[n].

The phase to amplitude converter 160 is configured to provide a digital amplitude signal y[n] 165 representing digital amplitude data corresponding to the phase points on the sinusoidal waveform associated with the digital phase signal u[n] 150. The digital to analog converter 170 is configured to convert the digital amplitude signal y[n] 165 into an analog sinusoidal signal y[t] 175.

The accompanying plot illustrates the phase signal u[n] 150 over time as the FCW x[n] changes from a first frequency $F_0$ to a second frequency $F_1$, and then back to $F_0$. When operating at $F_0$, the phase u[n] follows trajectory 180. When switching to $F_1$, the phase remains continuous but follows a new trajectory 190. When switching back to $F_0$, the phase again remains continuous and switches back to the original trajectory 180. Because the phase remains continuous over each frequency switch, the final phase, after switching back to $F_0$, is shifted by an offset value 195 from the phase that would have existed if the frequency switches had not occurred. The phase continuity and associated lack of coherence results from the memory effect that is imparted to the DDS by the accumulator, which is to say that previous FCWs x[n−1], x[n−2], . . . , are retained in the accumulated phase value a[n]. For this reason, DDS 100 is a non-phase coherent DDS.

Figure 2:
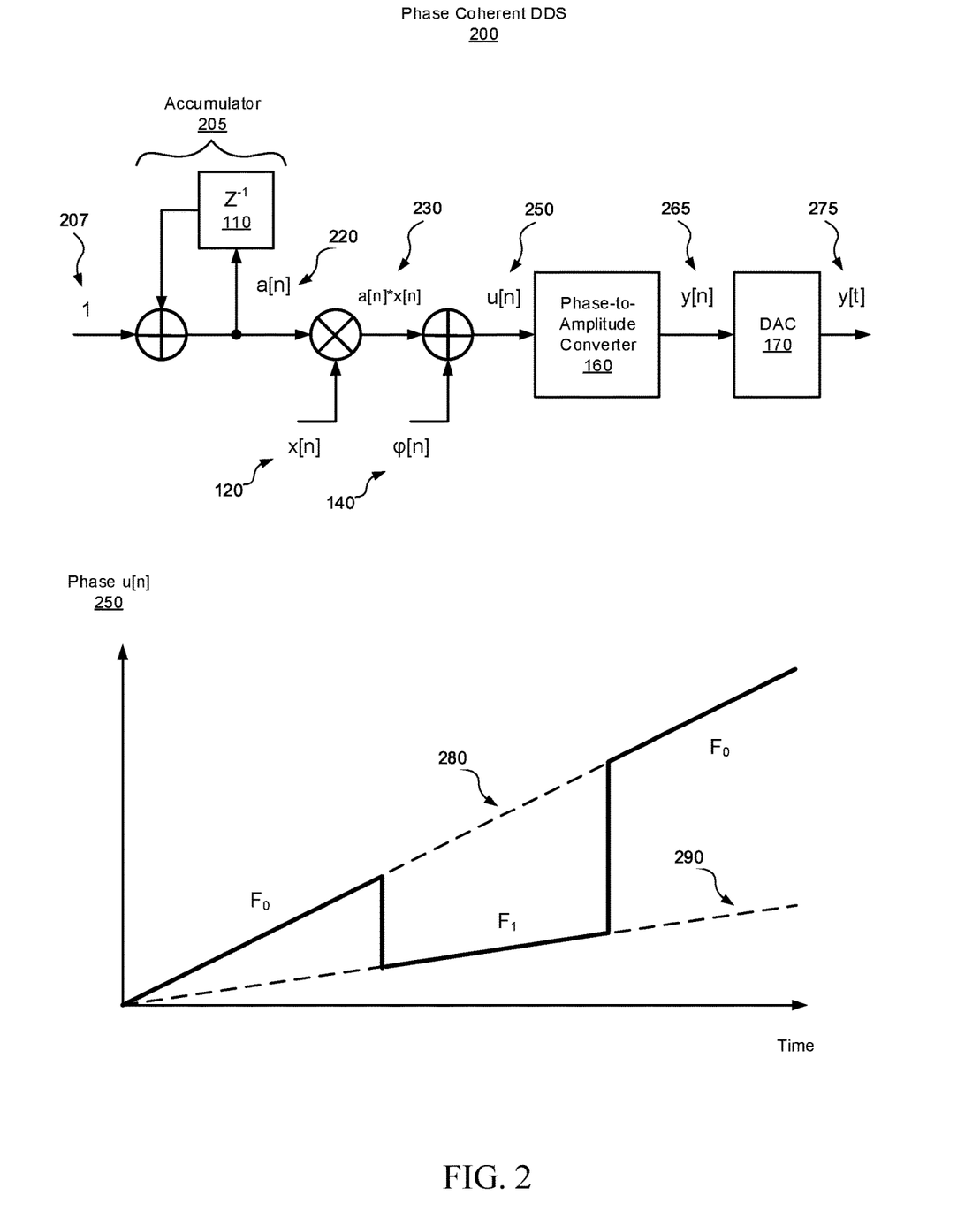
FIG. 2 is a block diagram of a phase coherent DDS that utilizes a computationally intensive multiply on each clock cycle, and the resulting phase output.

FIG. 2 is a block diagram of a phase coherent DDS 200 that utilizes a computationally intensive multiply on each clock cycle, and the resulting phase output 250. DDS 200 comprises an accumulator 205 configured to accumulate a unity value 207 on each clock cycle (n) to generate an incrementing reference count a[n] 220 which is then multiplied by the current FCW x[n] 120 to produce a new phase a[n]*x[n] 230. As with DDS 100, an additional summer may also be used to add a desired phase offset φ[n] 140 to a[n]*x[n], at any sample n to generate an incrementing digital phase signal u[n] 250.

Since x[n] is not included in the accumulation operation of DDS 200, the FCW memory effect is avoided, and phase coherency is achieved when the frequency changes. This advantage, however, comes at the expense of performing a computationally intensive multiply operation on every clock cycle (n).

As with DDS 100, a phase to amplitude converter 160 is configured to provide a digital amplitude signal y[n] 265 representing digital amplitude data corresponding to the phase points on the sinusoidal waveform associated with the digital phase signal u[n] 250, and a digital to analog converter 170 is configured to convert the digital amplitude signal y[n] 265 into an analog sinusoidal signal y[t] 275.

The accompanying plot illustrates the phase signal u[n] 250 over time as the FCW x[n] changes from a first frequency $F_0$ to a second frequency $F_1$, and then back to $F_0$. When operating at $F_0$, the phase u[n] follows trajectory 280. When switching to $F_1$, the phase undergoes a discontinuity and follows a new trajectory 290. When switching back to $F_0$, the phase again switches back to the original trajectory 280 in a discontinuous manner. The phase discontinuities that occur at each frequency switch, allow the phase to remain coherent. Thus, there is no phase offset when switching back from Fr to $F_0$. Instead, the phase remains where it would have been if the frequency switches had not occurred.

Figure 3:
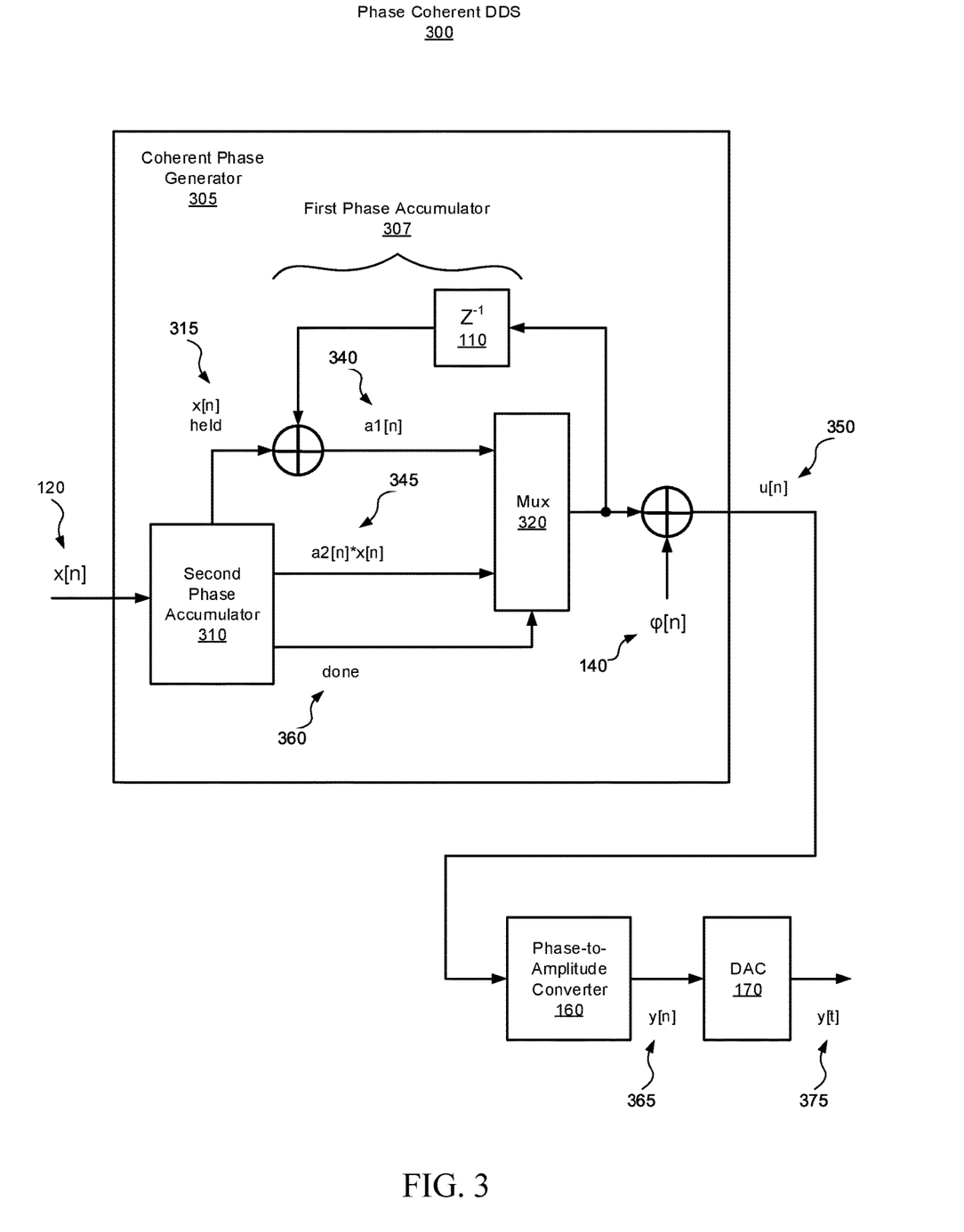
FIG. 3 is a block diagram of a phase coherent DDS, in accordance with certain embodiments of the present disclosure.

FIG. 3 is a block diagram of a phase coherent DDS 300, in accordance with certain embodiments of the present disclosure. The operation of phase coherent DDS 300 will be explained in detail below, but at a high level, DDS 300 operates in a manner similar to DDS 100 (e.g., accumulating the FCW) while the FCW remains constant, and then temporarily operates in a manner similar to DDS 200 (e.g., multiplying an incrementing accumulator by the FCW) when the FCW changes. This significantly reduces the number of multiplication operations (e.g., restricted to times when the FCW changes) and thus provides phase coherence with improved computational efficiency.

The phase coherent DDS 300 is shown to include a coherent phase generator 305, a phase-to-amplitude converter 160, and a digital to analog converter 170. The coherent phase generator 305 is shown to include a first phase accumulator 307, a second phase accumulator 310, and a multiplexer 320.

The first phase accumulator 307 is configured to accumulate an FCW, x[n] held 315, on each cycle (n) of a clock signal. The FCW, x[n] held 315, is the FCW value that is held over from before a change to a new FCW, as will be explained in greater detail below in connection with the second phase accumulator. The output of the first accumulator, designated a1 [n] 340, is a first digital phase signal representing phase data corresponding to phase points on a sinusoidal waveform at a frequency specified by the first FCW, x[n] held 315.

Figure 4:
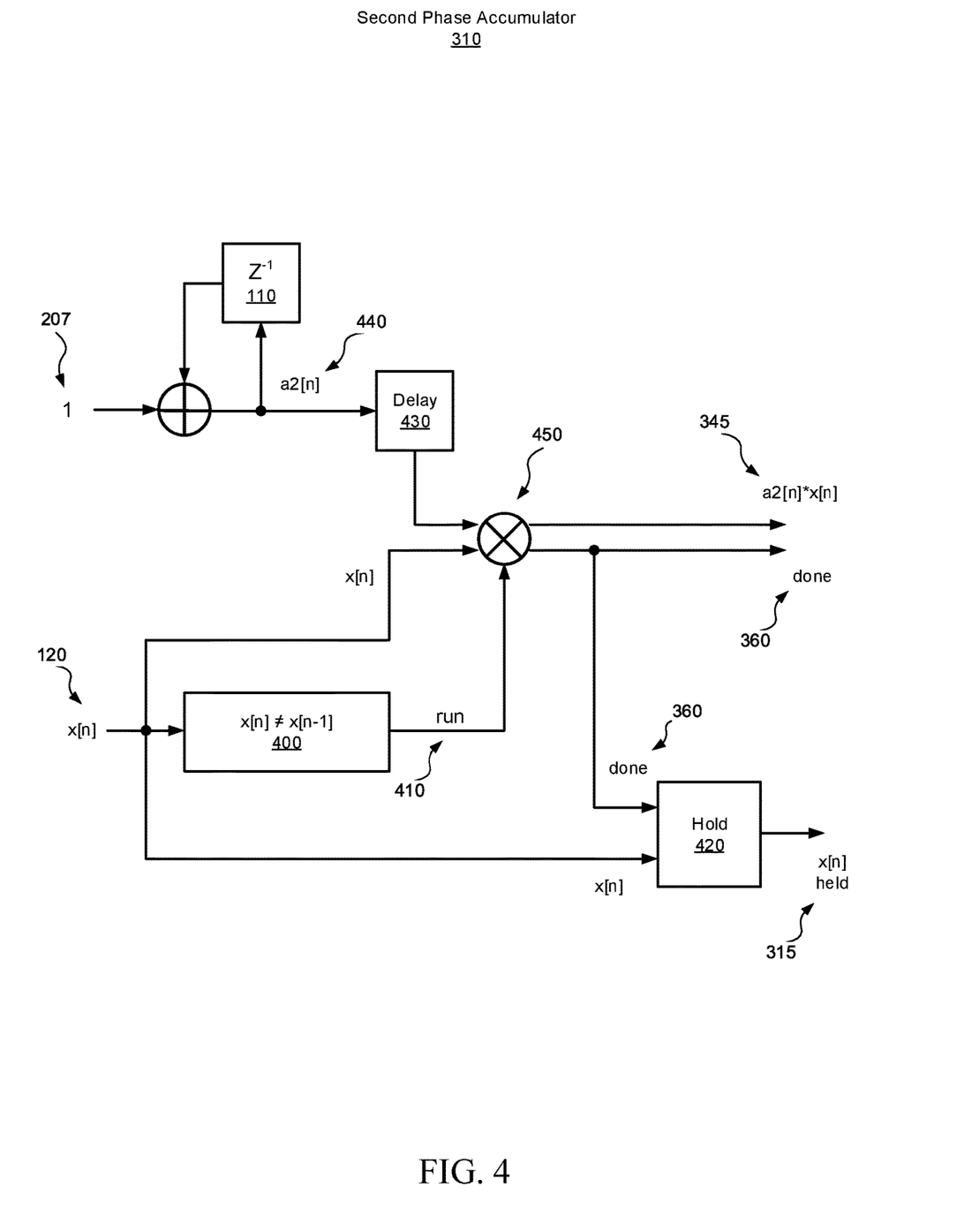
FIG. 4 is a block diagram of the second phase accumulator of the phase coherent DDS of FIG. 3, configured in accordance with certain embodiments of the present disclosure.

The second phase accumulator 310, which is illustrated in more detail in FIG. 4, is configured to accumulate a unity value 207 on each clock cycle (n) to generate an incrementing reference count a2[n] 440 which is then multiplied by the current FCW x[n] 120 to produce a second digital phase signal a2[n]*x[n] 345. The multiplication, however, is only performed when a run signal 410 is generated by comparator circuit 400, in response to detection of a change in the current FCW x[n] relative to the previous FCW x[n−1]. The second digital phase signal a2[n]*x[n] 345 represents phase data corresponding to phase points on a second sinusoidal waveform at a frequency specified by the current (i.e., changed) FCW x[n] 120.

The multiplier 450 is also configured to generate a done signal 360 to indicate that the multiplication, which can take multiple clock cycles, has completed. The done signal 360 is provided to the hold circuit 420 and the multiplexer 320. The hold circuit 420 is configured to generate x[n] held 315 as the value of x[n] 120 when the done signal 360 is asserted (i.e., when the multiplication is completed and the second digital phase signal 345 is available as a coherent phase). In some embodiments, the multiplication may be performed as a sequence of bit shifts and summations.

The multiplexer 320 is configured to select between the first and second digital phase signals based on the completion status of the multiplication operation, as indicated by the done signal 360. Until the multiplication has competed, the first digital phase signal is selected. Once the multiplication operation has completed, the second digital phase signal is selected, and the DDS then runs coherently on the new phase.

In some embodiments, a delay circuit 430 may be included to delay the reference count a2[n] 440 to the multiplier 450 by a time delay associated with a known or otherwise pre-determined time required to generate the second digital phase signal 345.

In some embodiments, an additional summer may also be employed to add a desired/adjustable phase offset φ[n] 140 to the output of the multiplexer 320, at any sample n, to generate the selected digital phase signal u[n] 350.

As previously described, the phase to amplitude converter 160 is configured to provide a digital amplitude signal y[n] 365 representing digital amplitude data corresponding to the phase points on the sinusoidal waveform associated with the selected digital phase signal u[n] 350, and the digital to analog converter 170 is configured to convert the digital amplitude signal y[n] 365 into an analog sinusoidal signal y[t] 375.

In some embodiments, the second phase accumulator is implemented as a counter configured to increment in response to each clock pulse (e.g., cycle (n) of the clock signal) to produce the incrementing reference count a2[n] 440. In some embodiments, the counter is configured to increment until the second phase accumulator steps through the phase points on the second sinusoidal waveform within one complete cycle of the second sinusoidal waveform and then resets to zero. In some embodiments, the counter is configured to truncate overflows of the second phase accumulator according to a modulo operation when the second phase accumulator exceeds 2p phase points where p is the width of the second phase accumulator in bits.

Figure 5:
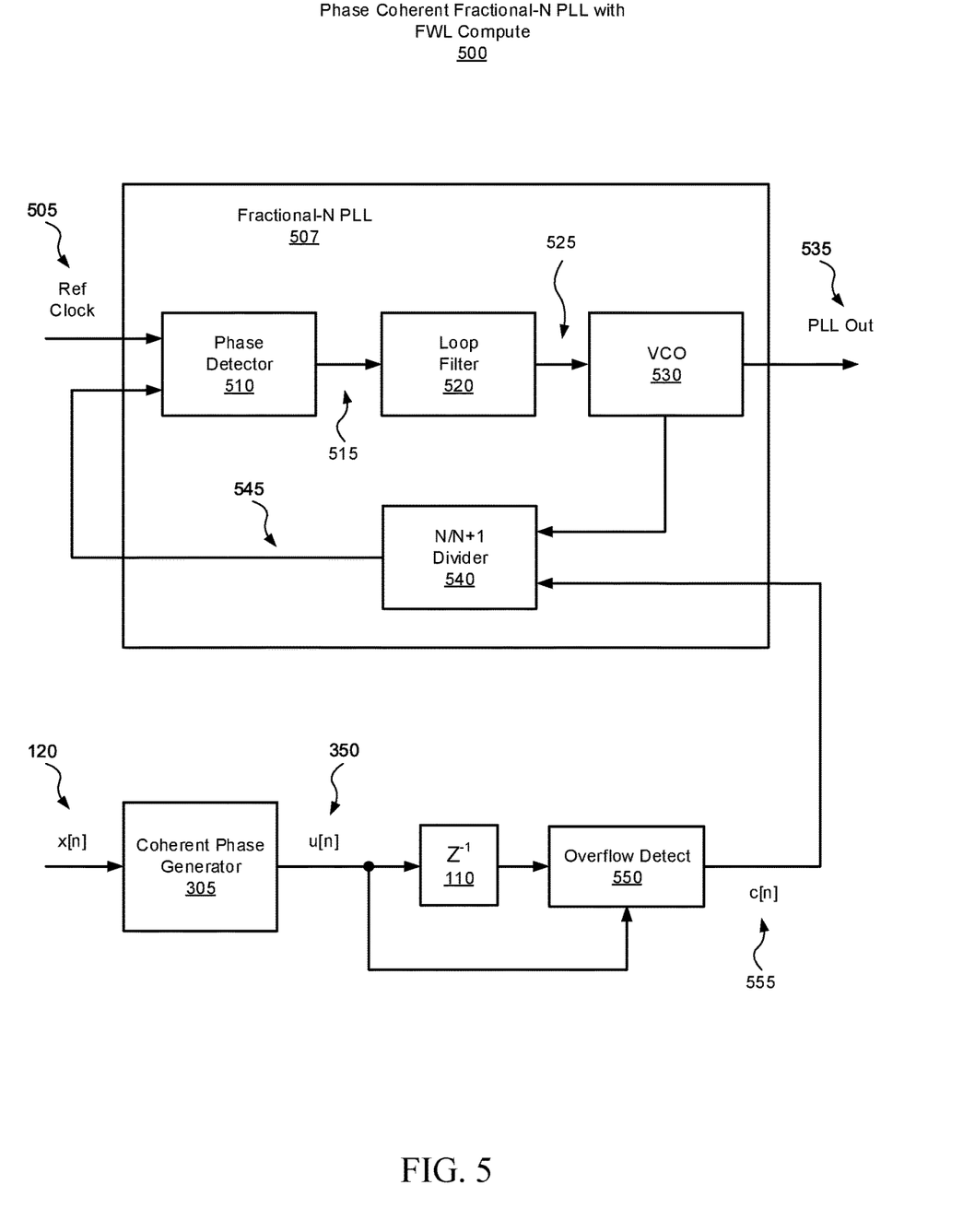
FIG. 5 is a block diagram of a phase coherent fractional-N PLL, in accordance with certain embodiments of the present disclosure.

FIG. 5 is a block diagram of a phase coherent fractional-N PLL 500, in accordance with certain embodiments of the present disclosure. The phase coherent fractional-N PLL 500 may also be referred to as a first order or single stage DSM phase coherent fractional-N PLL. The phase coherent fractional-N PLL 500 is shown to include a fractional-N PLL circuit 507, the coherent phase generator 305, and an overflow detect circuit 550.

The fractional-N PLL circuit 507 is shown to include a fractional-N divider 540, a phase detector 510 coupled to the fractional-N divider 540, a loop filter 520 coupled to the phase detector 510, and a voltage controlled oscillator 530 coupled to the loop filter 520.

The fractional-N PLL circuit 507 dithers the divider 540 that feeds the phase detector 510 to achieve a divide ratio between N and N+1. The coherent phase generator 305 drives this dithering with a divide ratio of N+1 when the accumulator overflows and divide ratio of N otherwise. In more detail, the fractional-N divider is configured to perform a fractional division of the output signal 535 of the fractional-N PLL circuit based on a carry bit c[n] 555 to generate a fractionally divided output signal 545. The phase detector 510 is configured to generate a phase adjustment signal 515 based on a phase comparison of the reference clock signal 505 to the fractionally divided output signal 545. The loop filter is configured to smooth the phase adjustment signal 515 to be provided to the voltage controlled oscillator 530. The voltage controlled oscillator 530 is configured to generate an analog sinusoidal signal as the output signal 535 of the fractional-N PLL circuit based on the smoothed phase adjustment signal 525.

The coherent phase generator 305 is configured to generate a digital phase signal u[n] 350, as described previously in connection with the phase coherent DDS 300. In this case, however, the input x[n] 120 is a fractional divide control word, the clock signal which controls the coherent phase generator 305 is the reference clock 505, and the digital phase signal u[n] indirectly drives the output phase of the PLL.

The overflow detect circuit 550 is configured to generate the carry bit c[n] 555 in response to detection of an overflow in the output u[n] 350 (i.e., the selected digital phase signal) of the coherent phase generator 305. The overflow detection is based on a comparison of u[n] to the previous value u[n−1]. The carry bit c[n] 555 is used to control fractional switching of the fractional-N PLL circuit 507 to maintain phase coherence between output signals 535 of the fractional-N PLL circuit, alternating between a first output frequency and a second output frequency.

Figure 6:
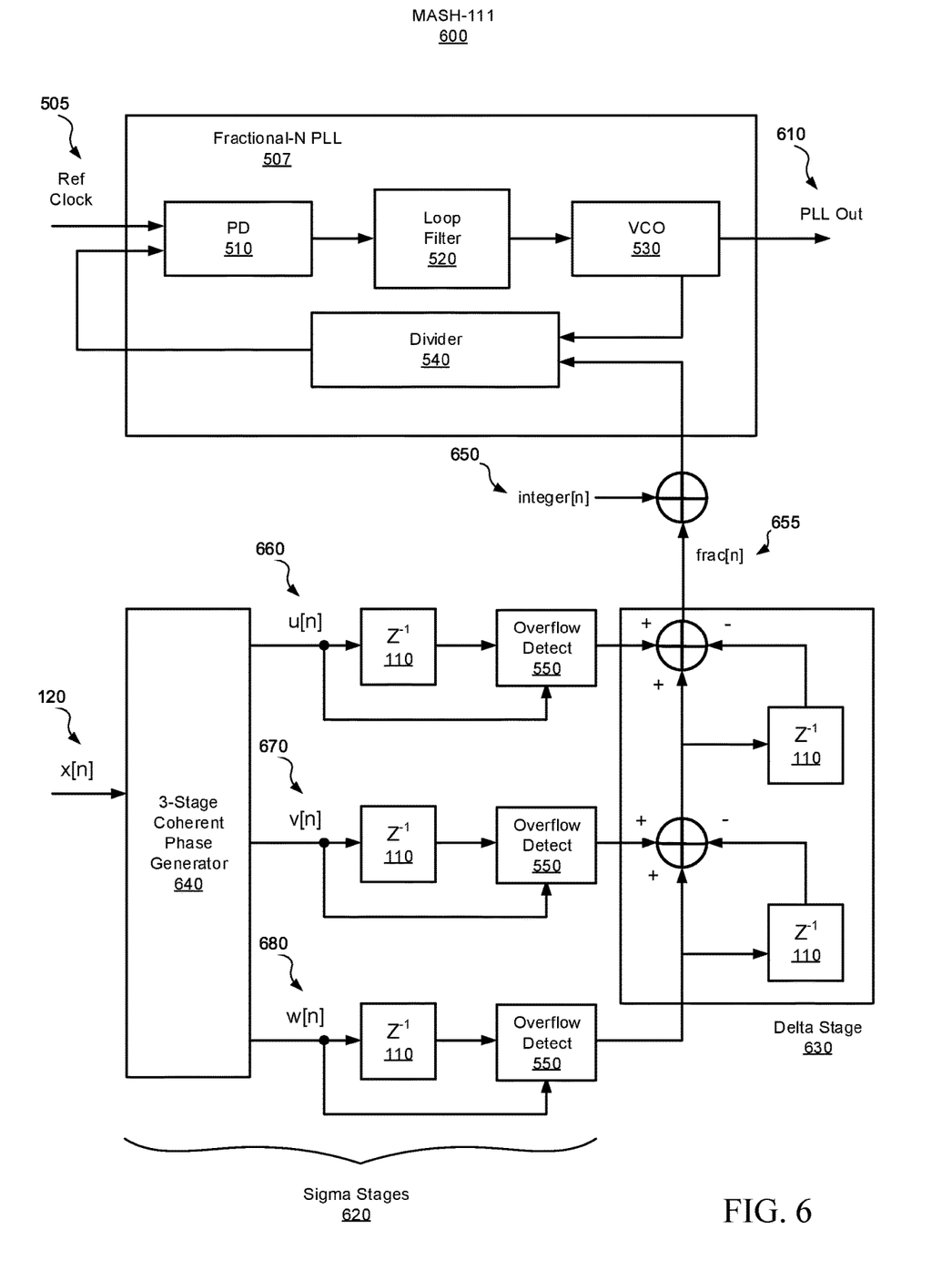
FIG. 6 is a block diagram of a 3-stage DSM phase coherent fractional-N PLL, in accordance with certain embodiments of the present disclosure.

FIG. 6 is a block diagram of a 3-stage DSM phase coherent fractional-N PLL 600, in accordance with certain embodiments of the present disclosure. The 3-stage DSM phase coherent fractional-N PLL 600 is sometimes also referred to as a MASH-111 circuit. Because fractional-N PLLs toggle between N and N+1 at fixed periodic intervals, undesired spurious signal may be introduced near the desired output frequency. By using a DSM to shift the divide noise quantization away from DC, spurs can be reduced. The use of a coherent phase generator, as previously described, in the sigma stages 620 of the DSM, enables coherent phase operation when frequencies are switched (for example, in a frequency hopping application).

The MASH-111 circuit 600 is shown to include a fractional-N PLL 507, the operation of which has been described above in connection with FIG. 5. The MASH-111 circuit 600 also includes 3 sigma stages 620 (in this example) and a delta stage 630. The sigma stages 620 employ a 3-stage coherent phase generator 640 and 3 overflow detect circuits 550. The MASH-111 circuit 600, of this example, uses a divide ratio that includes an integer portion integer[n] 650 and a fractional portion frac[n] 655. The fractional portion 655 is generated by the delta stage 630 as a combination of overflow detects of the three outputs of the 3-stage coherent phase generator 640, u[n] 660, v[n] 670, and w[n] 680, as shown.

Figure 7:
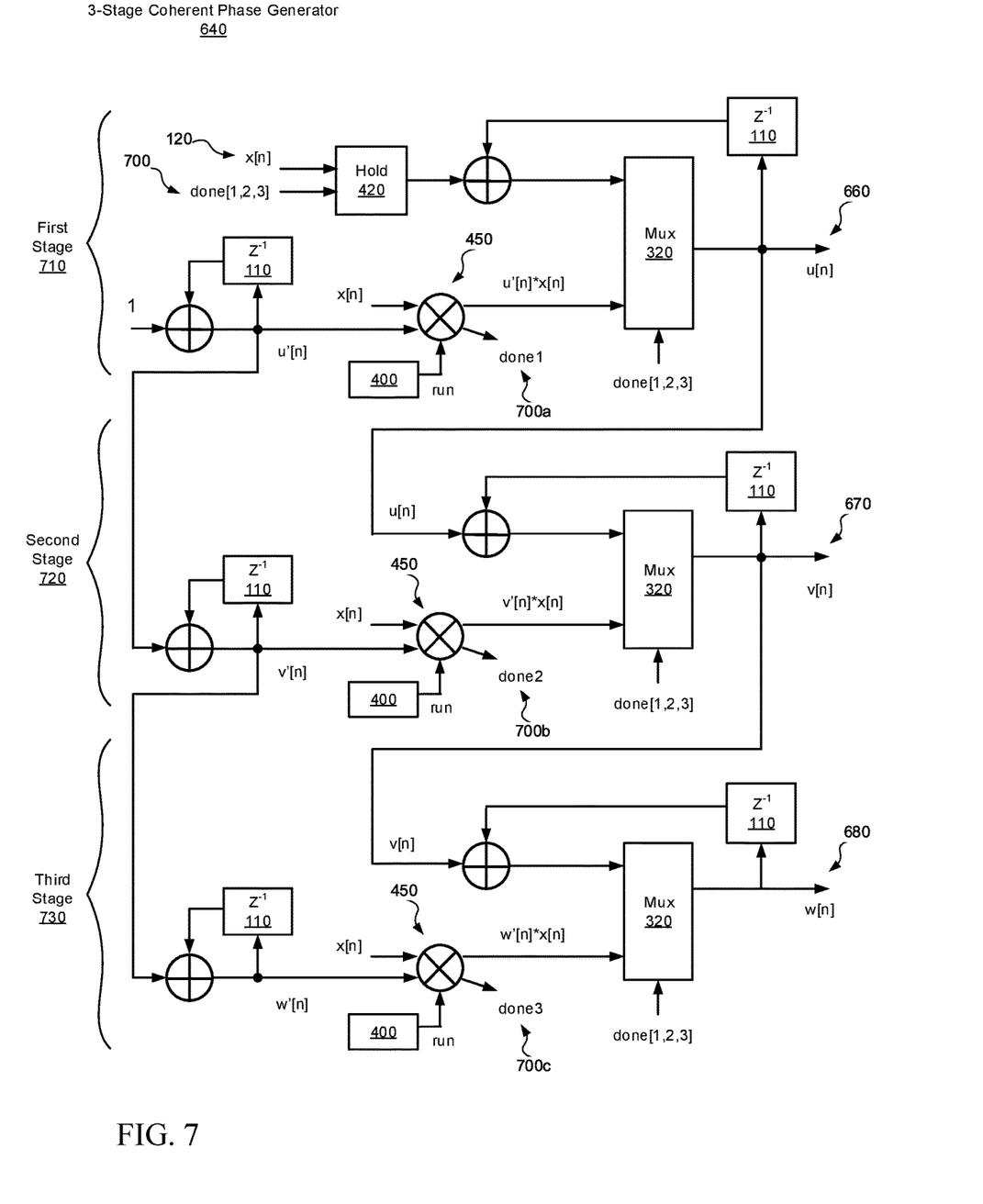
FIG. 7 is a block diagram of a coherent phase generator, configured in accordance with certain embodiments of the present disclosure.

FIG. 7 is a block diagram of the 3-stage coherent phase generator 640, configured in accordance with certain embodiments of the present disclosure. The 3-stage coherent phase generator 640 is shown to include three coherent phase generators 710, 720, 730, which operate in the manner described previously with respect to coherent phase generator 305. Coherent phase generators 710, 720, 730 are connected in a series cascade configuration such that the output of the first generator u[n] 660 is fed to the second generator and the output of the second generator v[n] 670 is fed to the third generator. The hold circuit 420 uses a combination (e.g., logical and) of done signals 700 from each of the three multipliers.

Although a 3-stage system has been illustrated herein, it will be appreciated that any number of stages may be used in alternate embodiments.

Methodology

Figure 8:
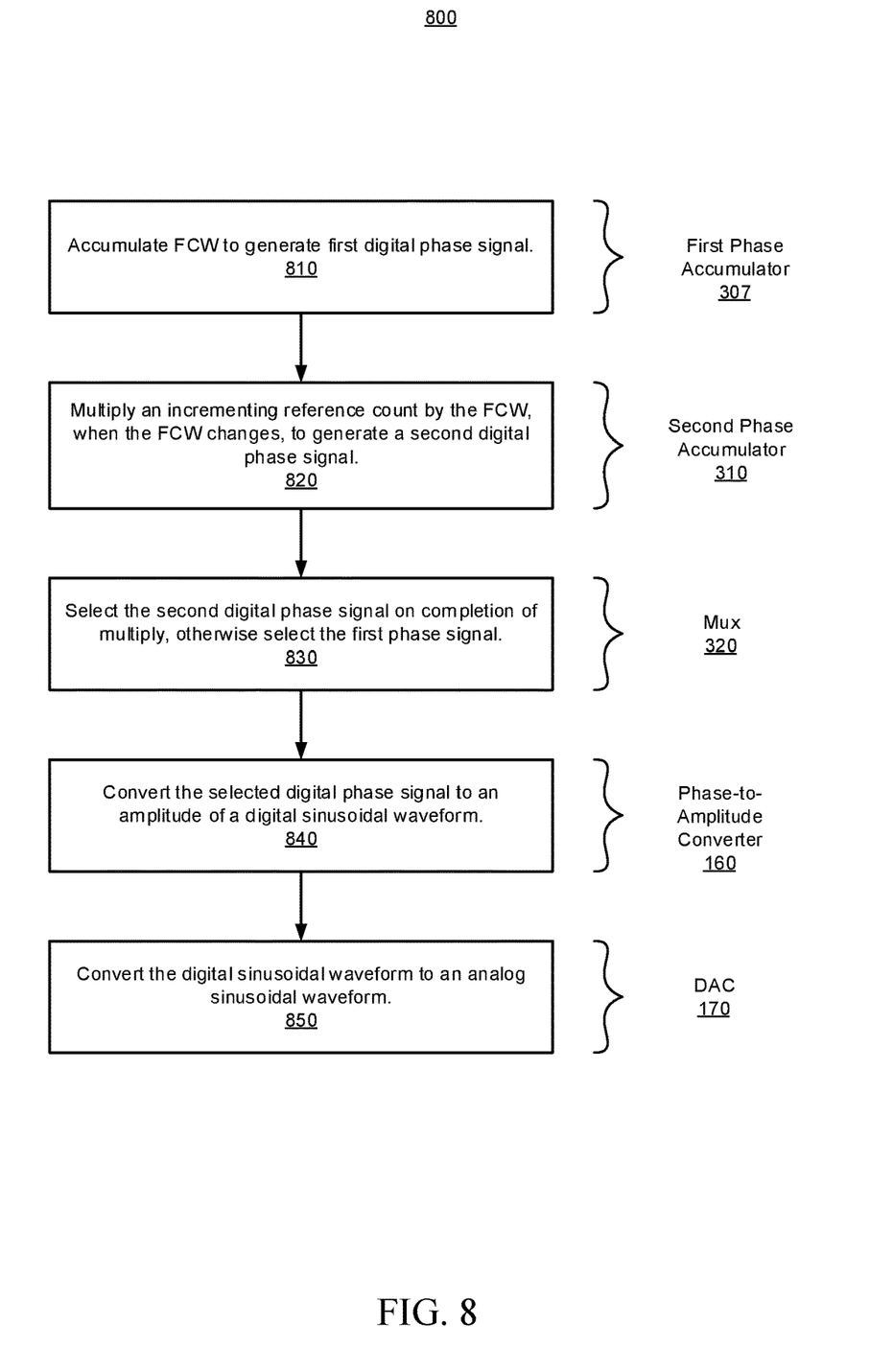
FIG. 8 is a flowchart illustrating a methodology for performing phase coherent direct digital synthesis, in accordance with an embodiment of the present disclosure.

FIG. 8 is a flowchart illustrating a methodology 800 for performing phase coherent direct digital synthesis, in accordance with an embodiment of the present disclosure. As can be seen, example method 800 includes a number of phases and sub-processes, the sequence of which may vary from one embodiment to another. However, when considered in aggregate, these phases and sub-processes form a process for phase coherent direct digital synthesis, in accordance with certain of the embodiments disclosed herein. These embodiments can be implemented, for example using the circuit illustrated in FIGS. 3 and 4, as described above. However other system architectures can be used in other embodiments, as will be apparent in light of this disclosure. To this end, the correlation of the various functions shown in FIG. 8 to the specific components illustrated in FIGS. 3 and 4, is not intended to imply any structural and/or use limitations. Rather other embodiments may include, for example, varying degrees of integration wherein multiple functionalities are effectively performed by one system. Numerous variations and alternative configurations will be apparent in light of this disclosure.

In one embodiment, method 800 commences, at operation 810, by accumulating an FCW in response to a clock signal to produce a first digital phase signal. The first digital phase signal represents phase data corresponding to phase points on a first sinusoidal waveform.

Next, at operation 820, a reference count is incremented in response to the clock signal. The incrementing reference count is multiplied by the FCW when a change in the FCW is detected. The multiplication produces a second digital phase signal representing phase data corresponding to phase points on a second sinusoidal waveform. Limiting the multiplication operations to times when the FCW changes provides phase coherence with improved computational efficiency.

At operation 830, a multiplexer selects between the first and second digital phase signals based on the completion status of the multiplication operation. If the multiplication operation has completed then the second digital phase signal is selected, otherwise the first digital phase signal is selected.

At operation 840, a digital amplitude signal is generated based on the selected digital phase signal. The digital amplitude signal represents digital amplitude data corresponding to the phase points on a selected sinusoidal waveform that is associated with the selected digital phase signal. At operation 850, the digital amplitude signal is converted into an analog sinusoidal signal.

Of course, in some embodiments, additional operations may be performed, as previously described in connection with the system. These additional operations may include, for example, adding an adjustable phase offset to the selected digital phase signal. In some embodiments, the incrementing reference count is delayed by a time delay associated with a pre-determined time required to generate the second digital phase signal.

In some embodiments, the disclosed phase coherent generation techniques may be applied to phase coherent fractional-N PLL devices and multistage DSM phase coherent fractional-N PLL devices, as previously described.

In some embodiments, the disclosed techniques may be implemented using a processor and/or a memory. It will be appreciated, however, that other embodiments are not limited to any particular hardware configuration. The processor can be any suitable processor, and may include one or more coprocessors or controllers. The processor (or processor cores) may be any type of processor, such as, for example, a micro-processor, an embedded processor, a digital signal processor (DSP), a graphics processor (GPU), a tensor processing unit (TPU), a network processor, a field programmable gate array or other device configured to execute code. The processor may be implemented as a complex instruction set computer (CISC) or a reduced instruction set computer (RISC) processor. The memory can be implemented using any suitable type of digital storage including, for example, flash memory and/or random-access memory (RAM). In some embodiments, the memory may include various layers of memory hierarchy and/or memory caches. Memory may be implemented as a volatile memory device such as, but not limited to, a RAM, dynamic RAM (DRAM), or static RAM (SRAM) device.

It will be appreciated that in some embodiments, the various components of the disclosed devices may be combined or integrated in a system-on-a-chip (SoC) architecture. In some embodiments, the components may be hardware components, firmware components, software components or any suitable combination of hardware, firmware or software.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the methodologies disclosed herein to be implemented. The instructions can be encoded using a suitable programming language, such as C, C++, object oriented C, Java, JavaScript, Visual Basic .NET, Beginner's All-Purpose Symbolic Instruction Code (BASIC), or alternatively, using custom or proprietary instruction sets.

Other componentry and functionality not reflected in the illustrations will be apparent in light of this disclosure, and it will be appreciated that other embodiments are not limited to any particular hardware or software configuration. Thus, other embodiments may comprise additional, fewer, or alternative subcomponents as compared to those included in the examples previously described.

The aforementioned non-transitory computer readable medium may be any suitable medium for storing digital information, such as a hard drive, a server, a flash memory, and/or random-access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical entities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), desktop computers, laptop computers, tablet computers, communication devices, smartphones, etc. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood, however, that other embodiments may be practiced without these specific details, or otherwise with a different set of details. It will be further appreciated that the specific structural and functional details disclosed herein are representative of example embodiments and are not necessarily intended to limit the scope of the present disclosure. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

FURTHER EXAMPLE EMBODIMENTS

The following examples pertain to further embodiments, from which numerous permutations and configurations will be apparent.

One example embodiment of the present disclosure provides a phase coherent direct digital synthesis (DDS) device comprising: a first phase accumulator configured to accumulate a frequency control word in response to a clock signal to produce a first digital phase signal representing first phase data corresponding to phase points on a first sinusoidal waveform; a second phase accumulator configured to produce an incrementing reference count in response to the clock signal and configured to multiply the incrementing reference count by the frequency control word, the multiplication performed in response to detection of a change in the frequency control word, to produce a second digital phase signal representing second phase data corresponding to phase points on a second sinusoidal waveform; a multiplexer configured to provide the second digital phase signal as a selected digital phase signal in response to detected completion of the multiply, otherwise to provide the first digital phase signal as the selected digital phase signal; a phase-to-amplitude converter coupled to the multiplexer, the phase-to-amplitude converter configured to receive the selected digital phase signal and to provide a digital amplitude signal representing digital amplitude data corresponding to the phase points on a selected sinusoidal waveform, the selected sinusoidal waveform associated with the selected digital phase signal; and a digital-to-analog converter coupled to the phase-to-amplitude converter, the digital-to-analog converter configured to convert the digital amplitude signal into an analog sinusoidal signal.

In some cases, the phase coherent DDS device of claim 1, further comprises a summer configured to receive an adjustable phase offset and to add the adjustable phase offset to the selected digital phase signal. In some cases, the phase coherent DDS device of claim 1, further comprises a delay circuit configured to delay the incrementing reference count by a time delay associated with a pre-determined time required to generate the second digital phase signal. In some cases, the second phase accumulator comprises a counter configured to increment in response to each clock pulse of the clock signal to produce the incrementing reference count. In some such cases, the counter is configured to increment until the second phase accumulator steps through the phase points on the second sinusoidal waveform within one complete cycle of the second sinusoidal waveform and then resets to zero. In some such cases, the counter is configured to truncate overflows of the second phase accumulator according to a modulo operation when the second phase accumulator exceeds 2p phase points where p is the width of the second phase accumulator in bits.

Another example embodiment of the present disclosure provides a phase coherent fractional-N phase locked loop (PLL) device comprising: a fractional-N PLL circuit; a coherent phase generator circuit coupled to the fractional-N PLL circuit comprising: a first phase accumulator configured to accumulate a fractional divide control word in response to a reference clock signal to produce a first digital phase signal; a second phase accumulator configured to produce an incrementing reference count in response to the reference clock signal and configured to multiply the incrementing reference count by the fractional divide control word, the multiplication performed in response to detection of a change in the fractional divide control word, to produce a second digital phase signal; and a multiplexer configured to provide the second digital phase signal as a selected digital phase signal in response to detected completion of the multiply, otherwise to provide the first digital phase signal as the selected digital phase signal; and an overflow detection circuit coupled to the coherent phase generator circuit and configured to generate a carry bit based on detection of an overflow of the selected digital phase signal, the carry bit to control fractional switching of the fractional-N PLL circuit to maintain phase coherence between output signals of the fractional-N PLL circuit, alternating between a first output frequency and a second output frequency.

In some cases, the fractional-N PLL circuit further comprises: a fractional-N divider configured to perform a fractional division of the output signal of the fractional-N PLL circuit based on the carry bit to generate a fractionally divided output signal; a phase detector coupled to the fractional-N divider and configured to generate a phase adjustment signal based on a phase comparison of the reference clock signal to the fractionally divided output signal; a loop filter coupled to the phase detector and configured to smooth the phase adjustment signal; and a voltage controlled oscillator coupled to the loop filter and configured to generate an analog sinusoidal signal as the output signal of the fractional-N PLL circuit based on the smoothed phase adjustment signal. In some cases, the coherent phase generator circuit further comprises a summer configured to receive an adjustable phase offset and to add the adjustable phase offset to the selected digital phase signal. In some cases, the coherent phase generator circuit further comprises a delay circuit configured to delay the incrementing reference count by a time delay associated with a pre-determined time required to generate the second digital phase signal. In some cases, the second phase accumulator further comprises a counter configured to increment in response to each clock pulse of the reference clock signal to produce the incrementing reference count. In some such cases, the counter is configured to increment until the second phase accumulator steps through one complete phase cycle and then resets to zero. In some such cases, the counter is configured to truncate overflows of the second phase accumulator according to a modulo operation.

Another example embodiment of the present disclosure provides a multistage delta-sigma modulator (DSM) phase coherent fractional-N phase locked loop (PLL) device comprising: a fractional-N PLL circuit; a first sigma stage; a second sigma stage coupled to the first sigma stage in a series cascade configuration, wherein each of the first and second sigma stages are configured to generate respective first carry-out bits and second carry-out bits, each of the first and second sigma stages comprising respective coherent phase generator circuits and overflow detection circuits; and a delta stage configured to generate a carry-sum of the first carry-out bits and the second carry-out bits and to subtract previously generated first carry-out bits, the carry-sum to control fractional switching of the fractional-N PLL circuit to maintain phase coherence between output signals of the fractional-N PLL circuit, alternating between a first output frequency and a second output frequency.

In some cases, the coherent phase generator circuit comprises: a first phase accumulator configured to accumulate a fractional divide control word in response to a reference clock signal to produce a first digital phase signal; a second phase accumulator configured to produce an incrementing reference count in response to the reference clock signal and configured to multiply the incrementing reference count by the fractional divide control word, the multiplication performed in response to detection of a change in the fractional divide control word, to produce a second digital phase signal; and a multiplexer configured to provide the second digital phase signal as a selected digital phase signal in response to detected completion of the multiply, otherwise to provide the first digital phase signal as the selected digital phase signal. In some cases, the overflow detection circuit is configured to generate the respective first carry-out bits and second carry-out bits based on detection of an overflow of the selected digital phase signal. In some cases, the fractional-N PLL circuit further comprises: a multi-modulus divider configured to perform a fractional division of the output signal of the fractional-N PLL circuit based on the carry-sum to generate a fractionally divided output signal; a phase detector coupled to the multi-modulus divider and configured to generate a phase adjustment signal based on a phase comparison of the reference clock signal to the fractionally divided output signal; a loop filter coupled to the phase detector and configured to smooth the phase adjustment signal; and a voltage controlled oscillator coupled to the loop filter and configured to generate an analog sinusoidal signal as the output signal of the fractional-N PLL circuit based on the smoothed phase adjustment signal. In some cases, the coherent phase generator circuit further comprises a delay circuit configured to delay the incrementing reference count by a time delay associated with a pre-determined time required to generate the second digital phase signal. In some cases, the second phase accumulator further comprises a counter configured to increment in response to each clock pulse of the reference clock signal to produce the incrementing reference count. In some such cases, the counter is configured to increment until the second phase accumulator steps through one complete phase cycle and then resets to zero.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be appreciated in light of this disclosure. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner and may generally include any set of one or more elements as variously disclosed or otherwise demonstrated herein.

What is claimed is:

1. A phase coherent fractional-N phase locked loop (PLL) device comprising:
   a fractional-N PLL circuit;
   a coherent phase generator circuit coupled to the fractional-N PLL circuit comprising:
      a first phase accumulator configured to accumulate a fractional divide control word in response to a reference clock signal to produce a first digital phase signal;
      a second phase accumulator configured to produce an incrementing reference count in response to the reference clock signal and configured to multiply the incrementing reference count by the fractional divide control word, the multiplication performed in response to detection of a change in the fractional divide control word, to produce a second digital phase signal; and
      a multiplexer configured to provide the second digital phase signal as a selected digital phase signal in response to detected completion of the multiply, otherwise to provide the first digital phase signal as the selected digital phase signal; and
   an overflow detection circuit coupled to the coherent phase generator circuit and configured to generate a carry bit based on detection of an overflow of the selected digital phase signal, the carry bit to control fractional switching of the fractional-N PLL circuit to maintain phase coherence between output signals of the fractional-N PLL circuit, alternating between a first output frequency and a second output frequency.

2. The phase coherent fractional-N PLL device of claim 1, wherein the fractional-N PLL circuit further comprises:
   a fractional-N divider configured to perform a fractional division of the output signal of the fractional-N PLL circuit based on the carry bit to generate a fractionally divided output signal;
   a phase detector coupled to the fractional-N divider and configured to generate a phase adjustment signal based on a phase comparison of the reference clock signal to the fractionally divided output signal;
   a loop filter coupled to the phase detector and configured to smooth the phase adjustment signal; and
   a voltage controlled oscillator coupled to the loop filter and configured to generate an analog sinusoidal signal as the output signal of the fractional-N PLL circuit based on the smoothed phase adjustment signal.

3. The phase coherent fractional-N PLL device of claim 1, wherein the coherent phase generator circuit further comprises a summer configured to receive an adjustable phase offset and to add the adjustable phase offset to the selected digital phase signal.

4. The phase coherent fractional-N PLL device of claim 1, wherein the coherent phase generator circuit further comprises a delay circuit configured to delay the incrementing reference count by a time delay associated with a predetermined time required to generate the second digital phase signal.

5. The phase coherent fractional-N PLL device of claim 1, wherein the second phase accumulator further comprises a counter configured to increment in response to each clock pulse of the reference clock signal to produce the incrementing reference count.

6. The phase coherent fractional-N PLL device of claim 5, wherein the counter is configured to increment until the second phase accumulator steps through one complete phase cycle and then resets to zero.

7. The phase coherent fractional-N PLL device of claim 5, wherein the counter is configured to truncate overflows of the second phase accumulator according to a modulo operation.

* * * * *